United States Patent [19]

Alexander

[11] Patent Number: 4,669,152

[45] Date of Patent: Jun. 2, 1987

[54] CLOSURE FOR ELECTROSTATIC BAGS

[76] Inventor: Jack P. Alexander, 17611 Lenark St., Northridge, Calif. 91325

[21] Appl. No.: 825,475

[22] Filed: Feb. 3, 1986

[51] Int. Cl.⁴ .............................................. B65D 27/22
[52] U.S. Cl. .................................. 24/30.5 R; 24/489; 24/537; 24/562; 223/96
[58] Field of Search .................. 24/536, 537, 489, 490, 24/498, 30.5 R, 30.5 L, 30.5 P; 223/96

[56] References Cited

U.S. PATENT DOCUMENTS

| | | | |
|---|---|---|---|
| 1,380,210 | 5/1921 | James | 24/537 |
| 1,899,982 | 3/1933 | Olson | 24/489 |
| 1,962,851 | 6/1934 | Wiseman | 24/562 |
| 2,337,723 | 12/1943 | Levin | 223/96 |
| 2,425,241 | 8/1947 | Hawkins | 223/96 |
| 2,546,717 | 3/1951 | Beetlestone et al. | 223/96 |
| 3,002,240 | 10/1961 | Laguerre | 24/30.5 L |
| 3,100,324 | 8/1963 | Tutino et al. | 24/537 |
| 3,462,809 | 8/1969 | Froehlich, Jr. | 24/562 |
| 4,308,981 | 1/1982 | Miura | 223/96 |

FOREIGN PATENT DOCUMENTS 123444  1/1947  Australia ............................. 24/537

Primary Examiner—Victor N. Sakran
Attorney, Agent, or Firm—Poms, Smith, Lande & Rose

[57] ABSTRACT

The present invention provides an improved closure for ESD bags which provides an effective closure without causing the generation of additional charges nor blocking of the visibility of the component in the bag. More significantly, the present invention provides an effective yet easy to use closure which does not cause injury or irritation to the fingertips or fingernails of the ESD worker. The invention includes a pair of elongate rails which are substantially parallel when in a closed position. Support means are provided between the rails and a hinge for permitting the rails to move from the closed position to an open position. A latch slideable between a first closed position and a second open position maintains the rails in close relation when the invention is in use. The sliding motion of the latch obviates the necessity to pry open a snap as was necessary with the snapstick of the prior art. In a particular embodiment, the supports are notched to assist in the maintenance of the closure. Further provided in a specific embodiment is an elongated ridge on one rail and a corresponding groove or trough on the other which assist in the closure of the bag. A yet more specific embodiment includes a handle for grasping or holding the closure.

2 Claims, 4 Drawing Figures

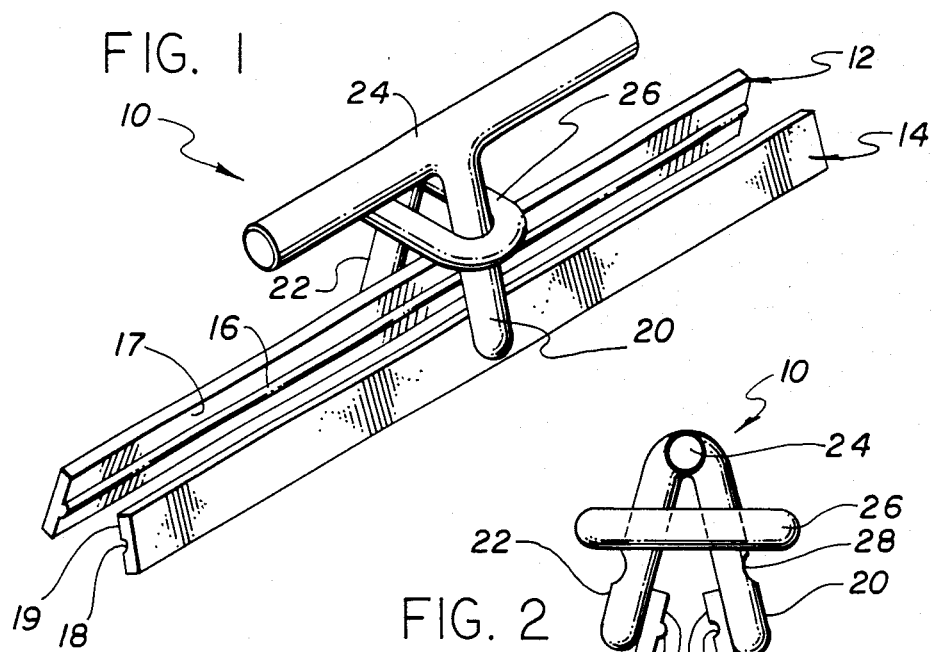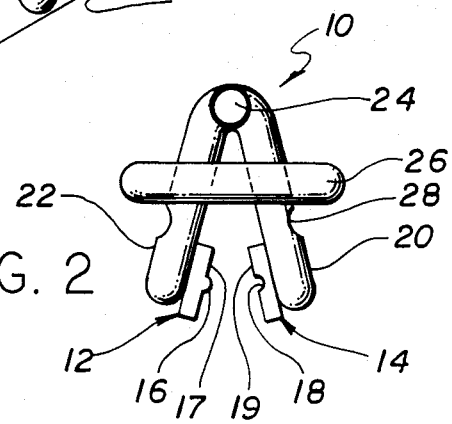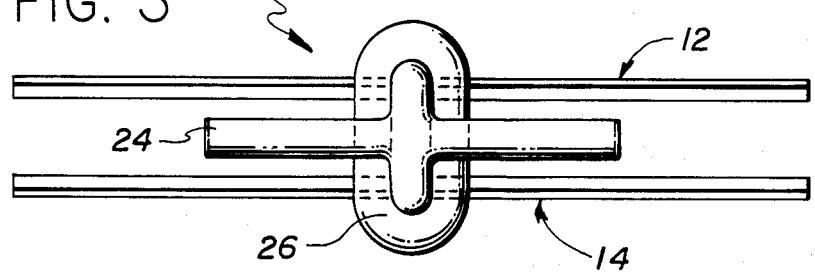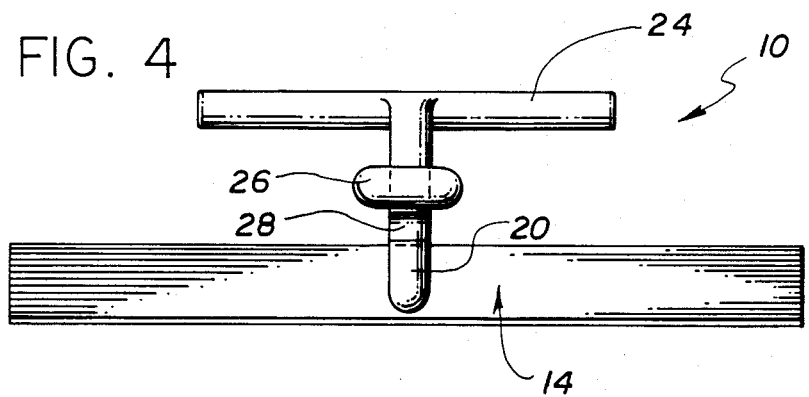

CLOSURE FOR ELECTROSTATIC BAGS

BACKGROUND OF THE INVENTION

1. Field of the Invention

The present invention relates to apparatus and techniques used to shield sensitive electronic components from the deleterious effects of static electricity. More specifically, the present invention relates to apparatus used to seal bags used to shield and handle such sensitive electronic components.

While the present invention is described herein with reference to a specific embodiment in a particular application, those having ordinary skill in the art and access to the teachings of the present invention will recognize additional modifications and embodiments within the scope thereof.

2. Description of the Related Art

The harmful effects of static electricity on sensitive electronic components is now clearly recognized. In response to a serious need to mitigate this source of component failure, numerous elaborate procedural safeguards have been adopted. For example, since most of the exposure to electrostatic discharge (ESD) occurs during the human handling of the components, one procedure requires the worker to wear a wrist strap which is electrically connected to a workbench which in turn is grounded. In apparent recognition of the severity of the problem, wriststraps are typically tested at least daily.

In these special areas where ESD cannot be tolerated, other safeguards are used as well including the handling of electronic components in special bags, boxes and etc.. These devices have particular electrostatic properties consistent with the restrictions of the controlled environment within which the handling is to take place. For example, while a conductive shield may be preferred for ESD reasons, state of the art materials such as conductive foam may not be suitable in say a clean room where fibers or other emmissions may comtaminate the controlled atmosphere.

A particular problem exists with the ESD bags currently in use. That is, the bags (typically made of an anti-static plastic and coated with a metal such as nickel) must be closed or a charge from the hands of the worker will migrate from the surface of the bag into the interior and onto the static sensitive component.

Prior art techniques for closing the bags include the use of stickers and plastic anti-static snap-sticks. A sticker is simply a tag with an adhesive backing which is used to attach the open end of the bag to the bag surface. Two principal problems in using the sticker have lead to the use of the snap-sticks: one is that as the sticker is removed, an electrostatic charge is often developed and the other is that the sticker blocks vision into the otherwise typically transparent bag. This necessitates additional handling of the bag and presents additional opportunities for ESD contamination.

The snap-stick is a closure made of an anti-static plastic which folds at its middle so that its ends may be snapped together. Thus, the snap-stick is used to snap the open end of the bag shut. Unfortunately, the use of the snap-stick has been found to be problematic in that the procedure of opening the snap has been of such difficulty as to cause an annoying injury to the fingernails of the bag handler. This has the effect of discouraging the use of the bag and the concomitant undesireable effects on production and costs.

Accordingly, there is a need in the art to provide a means for closing ESD bags which is simple and easy to use and which does not cause injury or discomfort to the bag handler.

SUMMARY OF THE INVENTION

The present invention provides an improved closure for ESD bags which provides an effective closure without causing the generation of additional charges nor blocking of the visibility of the component in the bag. More significantly, the present invention provides an effective yet easy to use closure which does not cause injury or irritation to the fingertips or fingernails of the ESD worker.

The invention includes a pair of elongate rails which are substantially parallel when in a closed position. Support means are provided between the rails and a hinge for permitting the rails to move from the closed position to an open position. A latch slideable between a first closed position and a second open position maintains the rails in close relation when the invention is in use. The sliding motion of the latch obviates the necessity to pry open a snap as was necessary with the snap-stick of the prior art.

In a particular embodiment, the supports are notched to assist in the maintenance of the closure. Further provided in a specific embodiment is a an elongated ridge on one rail and a corresponding groove or trough on the other which assist in the closure of the bag. A yet more specific embodiment includes a handle for grasping or holding the closure.

BRIEF DESCRIPTION OF THE DRAWINGS

FIG. 1 is a perspective view of an illustrative embodiment of the present invention.

FIG. 2 is a front elevational view of the illustrative embodiment of the present invention.

FIG. 3 is a top plan view of the illustrative embodiment of the present invention.

FIG. 4 is a side elevational view of the illustrative embodiment of the present invention.

DESCRIPTION OF THE INVENTION

As discussed more fully below, the present invention provides a closure for ESD bags featuring an operation that minimizes irritation and injury to the fingertips and fingernails of the worker.

As shown in the illustrative embodiments of FIGS. 1-4, the invention 10 includes elongated rails 12 and 14 which are substantially parallel when the invention 10 is in a first closed position. The length of the rails is determined with reference to the length of the bag to be closed.

As shown in the perspective view of FIG. 1 and the side elevational view of FIG. 2, the first rail 12 has a ridge 18 which runs along the interior surface 17 thereof. The second rail 14 has a corresponding groove or recession 18 running along the interior surface 19 thereof. In the preferred embodiment, the ridge 16 is aligned with the groove 18 so that when the rails 12 and 14 are in the closed position, the ridge 16 fits snugly into or onto the groove 18. Those having ordinary skill in the art will recognize that the size shape and location of the ridge 16 and the corresponding groove 18 can be varied as a matter of design choice without departing from the teachings of the present invention.

The rails 12 and 14 are supported in the illustrative embodiment 10 by two supports 20 and 22. The supports 20 and 22 may be cemented or welded to the rails or may be made integral with the rails as is known in the art. The mode of attachment is not critical to the invention. It is to be understood that the number of supports may be increased as necessary to provide an effective closure especially where the rails are chosen to be relatively long.

The supports 20 and 22 are attached to the rails 12 and 14 one end and to a hinge 24 on the other. The hinge 24 is shown in FIGS. 1, 3 and 4 as elongated to provide a handle for grasping and holding the invention 10. The hinge 24 may be an integrated plastic member with inherent resilient properties or a true mechanical hinge without departing from the scope of the invention. All that is required is that the hinge allow for the movement of the rails between a first closed position and a second open position.

The illustrative embodiment of FIGS. 1-4 shown an annular latch 26 which serves to secure the rails 12 and 14 in a closed position. The latch 26 may be made of metal, plastic or other suitable material. In the preferred embodiment, the latch 26 is made of the same material as the invention 10. The latch 26 is sized to provide adequate closure of the rails 12 and 14 when the latch 26 is slideably moved to its closed position in close proximity to the rails 12 and 14. FIG. 2 shows notches 28 in the supports 20 and 22 which serve as a resting place for the latch 26 in its closed position. The notches 28 thus help to maintain the latch 26 in place thereby maintaining the invention 10 in a closed position until the operator or worker moves the latch 26 to its open position.

In operation, the rails 12 and 14 are moved into position over the opening of an ESD bag. Next, the rails 12 and 14 are squeezed together closing the open end of the bag. The latch 26 is then slid from its open position to its closed position such that it engages the notches 28. The ESD bag is now secure and may be handled as desired without additional exposure to electrostatic charges.

When it is desired to open the bag, the operator or worker squeezes the rails 12 and 14 together while lifting the latch 26 from its closed position to its open position. Note that the closure 10 of the present invention is opened without necessitating the prying action of the prior art snap-stick. The middle of the fingers alone will operate to effect an opening of the closure 10. If a closure is well designed within the above teachings of the invention, the worker will be able to effect an opening of the closure 10 by squeezing the rails together and snapping the wrist so that the ring or latch 26 is lifted by centrifugal force or gravity to its open position. This operation thus results in additional productivity gains as the time required for opening and closing the bag is reduced and worker fatigue and irritation are minimized.

While the present invention has been described with reference to an illustrative embodiment, it is understood that the invention is not limited thereto. Those having ordinary skill in the art will recognize additional modifications and embodiments without departing from the scope of the present invention. For example, the scale of the closure and the material used in its construction may be varied without departing from the teachings of the invention. As mentioned above, the number of supports used; the number, size and shape of the protrusions and recessions on the interior faces of the rails; and the nature and shape of the hinge may similarly be changed without departing from the scope of the invention.

It is intended by the appended claims to cover any and all such modifications and embodiments. Accordingly, what is claimed is:

1. An improved closure for electrostatic bags, said closure having a closed position and an open position and comprising:
   first and second substantially flat elongate rails which are substantially parallel when said closure is in said closed position;
   support means having generally V-shaped configuration attaching said first and second flat elongated rails to a hinge means respectively for permitting said rails to move from said closed position to said open position;
   latch means for maintaining said rails in said closed position, said latch means slideable between a first closed position and a second position for opening of said closure whereby said closure operated by the translation of said latch therebetween;
   said first and second rails having flat mating areas for clamping said electrostatic bags;
   said first rail having at least one elongated protrusion and said second rail having at least one corresponding elongated recess in alignment therewith when said closure is in said closed position; and
   said closure being formed of a material having good anti-static properties, and more specifically having a resistivity equal to or less than that of the anti-static range of materials;
   said V-shaped support means and said hinge means being formed of a single unitary member having a substantially constant resistivity equal to or less than that of the anti-static range of materials;
   said V-shaped support means including two supports each of which has a notch on its outer surface for engagement by said latch means; and
   a handle means attached to said V-shaped support means and extending generally transversely therefrom for grasping and holding said closure, and for retaining said latch means as part of the closure assembly.

2. A closure as defined in claim 1 wherein said closure is formed of plastic material having a resistivity equal to or less than that of the anti-static range of materials.

* * * * *